(12) United States Patent
Gramuglia et al.

(10) Patent No.: US 12,224,368 B1
(45) Date of Patent: Feb. 11, 2025

(54) OPTOELECTRONIC DEVICE INCLUDING PHOTODIODE HAVING BURIED LAYER WITH DIFFERENT THICKNESSES

(71) Applicant: GlobalFoundries Singapore Pte. Ltd., Singapore (SG)

(72) Inventors: Francesco Gramuglia, Augsburg (DE); Eng Huat Toh, Singapore (SG); Ping Zheng, Singapore (SG)

(73) Assignee: GLOBALFOUNDRIES Singapore Pte. Ltd., Singapore (SG)

( * ) Notice: Subject to any disclaimer, the term of this patent is extended or adjusted under 35 U.S.C. 154(b) by 0 days.

(21) Appl. No.: 18/666,787

(22) Filed: May 16, 2024

(51) Int. Cl.
*H01L 31/107* (2006.01)
*H01L 31/0352* (2006.01)
*H01L 31/18* (2006.01)

(52) U.S. Cl.
CPC .... *H01L 31/107* (2013.01); *H01L 31/035272* (2013.01); *H01L 31/18* (2013.01)

(58) Field of Classification Search
None
See application file for complete search history.

(56) References Cited

U.S. PATENT DOCUMENTS

| 10,847,668 | B2 | 11/2020 | Takimoto et al. | |
|---|---|---|---|---|
| 2005/0255625 | A1* | 11/2005 | Janesick | H01L 27/14609 438/57 |
| 2020/0028019 | A1* | 1/2020 | Takimoto | H01L 31/107 |
| 2020/0044080 | A1* | 2/2020 | Sheu | H01L 29/0653 |
| 2020/0098803 | A1* | 3/2020 | Lo | H01L 27/14616 |

OTHER PUBLICATIONS

F. Gramuglia et al., "Engineering Breakdown Probability Profile for PDP and DCR Optimization in a SPAD Fabricated in a Standard 55 nm BCD Process," in IEEE Journal of Selected Topics in Quantum Electronics, vol. 28, No. 2: Optical Detectors, pp. 1-10, Mar.-Apr. 2022, Art No. 3802410, doi: 10.1109/JSTQE.2021.3114346.
X. Lu, M. -K. Law, Y. Jiang, X. Zhao, P. -I. Mak and R. P. Martins, "A 4-μm Diameter SPAD Using Less-Doped N-Well Guard Ring in Baseline 65-nm CMOS," in IEEE Transactions on Electron Devices, vol. 67, No. 5, pp. 2223-2225, May 2020, doi: 10.1109/TED.2020.2982701.

* cited by examiner

*Primary Examiner* — Nduka E Ojeh
(74) *Attorney, Agent, or Firm* — Anthony Canale

(57) ABSTRACT

The present disclosure generally relates to semiconductor devices for use in optoelectronic/photonic applications and integrated circuit (IC) chips. More particularly, the present disclosure relates to devices containing photodiodes such as avalanche photodiodes (APDs) and single photon avalanche diodes (SPADs). The present disclosure may provide a device including a substrate, a first well of a first conductivity type in the substrate, a second well of a second conductivity type in the substrate, and a buried layer of the second conductivity type in the substrate. The buried layer may be below the first well and the second well. The buried layer may have a first section and a second section, in which the first section has a larger thickness than the second section.

19 Claims, 8 Drawing Sheets

OPTOELECTRONIC DEVICE INCLUDING PHOTODIODE HAVING BURIED LAYER WITH DIFFERENT THICKNESSES

FIELD OF THE INVENTION

The present disclosure generally relates to semiconductor devices for use in optoelectronic/photonic applications and integrated circuit (IC) chips. More particularly, the present disclosure relates to devices containing photodiodes such as avalanche photodiodes (APDs) and single photon avalanche diodes (SPADs).

BACKGROUND

Optoelectronic or photonic devices are a type of semiconductor device that detects and harnesses electromagnetic energy such as light. The use of such devices in high-speed switching and transceiver devices in data communications are but a few examples that highlight the advantages of processing both optical and electrical signals within a single integrated circuit (IC) device. Examples of an optoelectronic device include single photon avalanche diodes (SPADs) and avalanche photodiodes (APDs). These types of photodiodes exploit the photon-triggered avalanche current of a reverse biased P-N junction to detect electromagnetic waves.

Photodiodes, such as SPADs, may have high breakdown voltages and therefore may require the use of high voltages for their operations. However, edge breakdowns may occur at the edges or the periphery of the photodiode due to the formation of a P-N junction between the edges of the photodiode and the circuitry proximal to the photodiode's periphery. Edge breakdowns can be parasitic and due to its lower breakdown voltage and the high operating voltage of the photodiode, the breakdown may occur at the edges of the photodiode before a breakdown occurs at a photosensitive portion of the photodiode. If the edge breakdown occurs at a voltage lower than the breakdown voltage at the photosensitive portion, a current may flow out from the edges of the photodiode (e.g., the cathode of the photodiode) towards the ground connection of the chip, preventing the application of the correct voltage for the operation of the photodiode, and therefore, causing a destructive failure of the chip.

SUMMARY

In an aspect of the present disclosure, there is provided a device including a substrate, a first well of a first conductivity type in the substrate, a second well of a second conductivity type in the substrate, and a buried layer of the second conductivity type in the substrate. The second conductivity type is of an opposite conductivity type to the first conductivity type. The first well is concentric with and laterally surrounded by the second well. The buried layer is below the first well and the second well. The buried layer has a first section and a second section, the first section has a larger thickness than the second section, and the first section is concentric with and laterally surrounded by the second section. The first section of the buried layer is aligned vertically below and in direct contact with the first well.

In another aspect of the present disclosure, there is provided a device including a substrate, a first well of a first conductivity type in the substrate, a second well of a second conductivity type in the substrate, and a buried layer of the second conductivity type in the substrate. The second conductivity type is of an opposite conductivity type to the first conductivity type. The first well is concentric with and laterally surrounded by the second well. The buried layer is below the first well and the second well. The buried layer has a first section and a second section, the first section is concentric with and laterally surrounded by the second section, and the second section of the buried layer has a lower dopant concentration than the first section of the buried layer. The first section of the buried layer is aligned vertically below and in direct contact with the first well.

In yet another aspect of the present disclosure, there is provided a method of forming a device by forming a first well of a first conductivity type in a substrate, forming a second well of a second conductivity type in the substrate, the second conductivity type is of an opposite conductivity type to the first conductivity type, the first well is formed to be concentric with and laterally surrounded by the second well, and forming a buried layer of the second conductivity type in the substrate. The buried layer is formed below the first well and the second well, the buried layer has a first section and a second section, the first section of the buried layer is formed with a larger thickness than the second section of the buried layer, the first section of the buried layer is formed to be concentric with and laterally surrounded by the second section of the buried layer. The first section of the buried layer is formed to be aligned vertically below and in direct contact with the first well.

BRIEF DESCRIPTION OF THE DRAWINGS

The present disclosure may be understood by reference to the following description taken in conjunction with the accompanying drawings.

For simplicity and clarity of illustration, the drawings illustrate the general manner of construction, and certain descriptions and details of well-known features and techniques may be omitted to avoid unnecessarily obscuring the discussion of the described embodiments of the present disclosure. Additionally, elements in the drawings are not necessarily drawn to scale. For example, the dimensions of some of the elements in the drawings may be exaggerated relative to other elements to help improve understanding of embodiments of the present disclosure. The same reference numerals in different drawings denote the same elements, while similar reference numerals may, but do not necessarily, denote similar elements.

DETAILED DESCRIPTION

Various illustrative embodiments of the present disclosure are described below. The embodiments disclosed herein are exemplary and not intended to be exhaustive or limiting to the present disclosure.

Figure 1A:
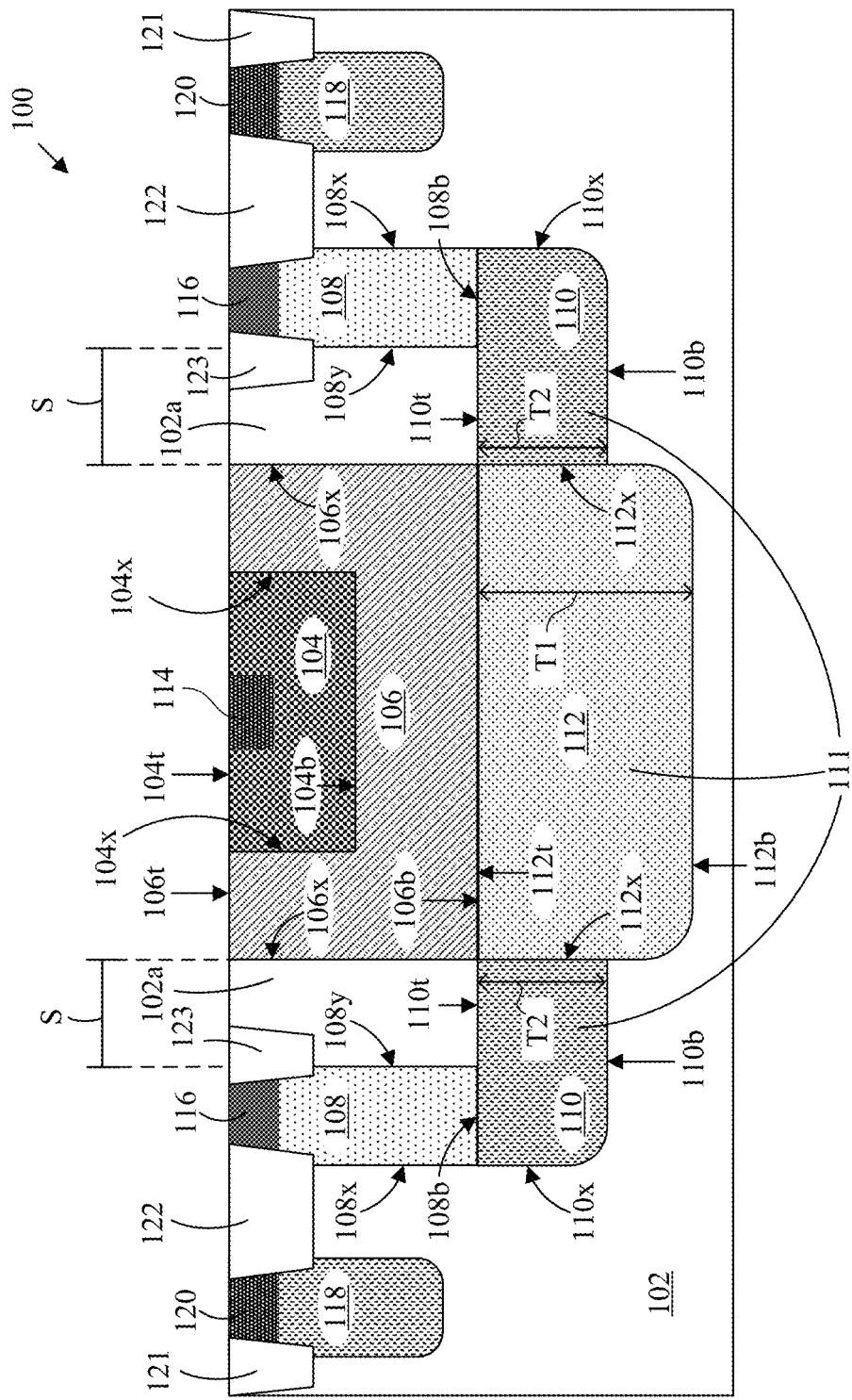
FIG. 1A is a cross-sectional view of an example of a device for optoelectronic applications.

Referring to FIG. 1A, an example of a device 100 for optoelectronic applications may include a substrate 102, a first well 106 of a first conductivity type in the substrate 102, a second well 108 of a second conductivity type in the substrate 102, and a buried layer 111 of the second conductivity type in the substrate 102. The first conductivity type may be of an opposite conductivity to the second conductivity type. For example, the first conductivity type may be a P type conductivity while the second conductivity type may be a N type conductivity, or vice versa.

Figure 1B:
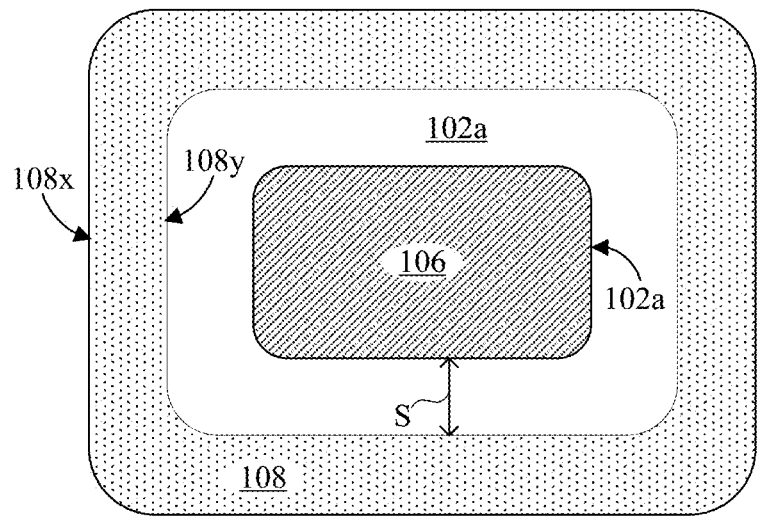
FIG. 1B and FIG. 1C are top-down views depicting geometric shapes of a first well and a second well of the device.
Figure 1C:
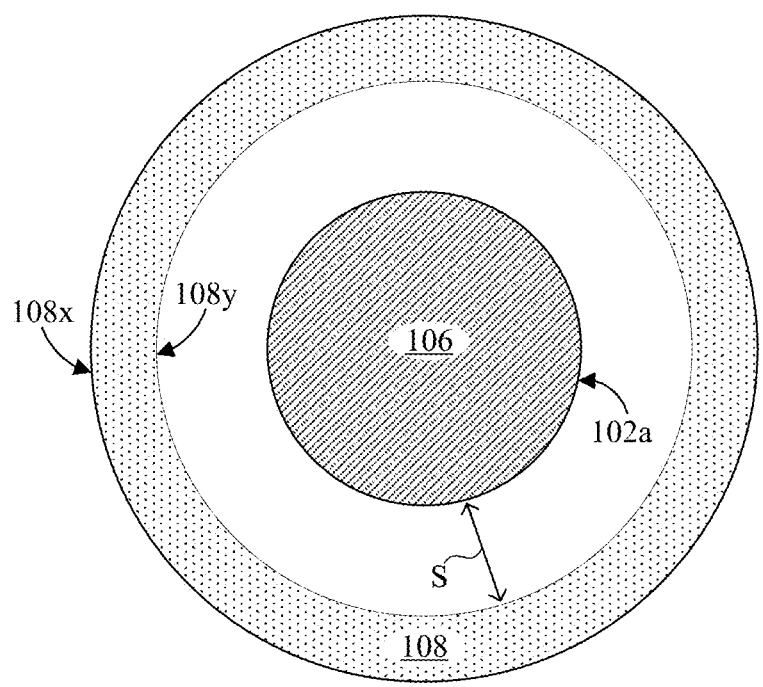

The first well 106 may be laterally surrounded by the second well 108. The first well 106 may also be concentric with the second well 108. The first well 106 may have a side boundary 106$x$, a top boundary 106$t$, and a bottom boundary 106$b$. The top boundary 106$t$ of the first well 106 may be coplanar with a top surface of the substrate 102. The side boundary 106$x$ of the first well 106 may define the geometric shape of the first well 106 when viewed from a top-down perspective. For example, as shown in FIG. 1B and FIG. 1C, when viewed from a top-down perspective, the first well 106 may have a circular, elliptical, or polygonal shape.

The second well 108 may have a bottom boundary 108$b$, an inner side boundary 108$y$, and an outer side boundary 108$x$. As shown in FIG. 1B and FIG. 1C, when viewed from a top-down perspective, the second well 108 may have an annular geometric shape defined by the inner side boundary 108$y$ and the outer side boundary 108$x$. The first well 106 may be laterally spaced apart from the second well 108 by the substrate 102. For example, the side boundary 106$x$ of the first well 106 may be spaced apart from the inner side boundary 108$y$ of the first well 106 by a spacing S. Accordingly, a portion 102$a$ of the substrate 102 may be laterally between the side boundary 106$x$ of the first well 106 and the inner side boundary 108$y$ of the second well 108. This portion 102$a$ of the substrate 102 may be referred to as a guard region.

As shown in FIG. 1A, the buried layer 111 may be below the first well 106 and the second well 108. The buried layer 111 may have a first section 112 and a second section 110. The first section 112 may be laterally surrounded by the second section 110. The first section 112 may be concentric with the second section 110. The first section 112 may have a larger thickness than the second section 110. The first section 112 of the buried layer 111 may have a top boundary 112$t$, a side boundary 112$x$, and a bottom boundary 112$b$. The first section 112 may have a first thickness T1, which may be defined as a distance between the top boundary 112$t$ and the bottom boundary 112$b$. The second section 110 of the buried layer 111 may have a top boundary 110$t$, a bottom boundary 110$b$, and a side boundary 110$x$. The second section 110 may have a second thickness T2, which may be defined as a distance between the top boundary 110$t$ and the bottom boundary 110$b$. Preferably, the top boundary 112$t$ of the first section 112 of the buried layer 111 may be substantially coplanar with the top boundary 110$t$ of the second section 110 of the buried layer 111. In other implementations (not shown), the top boundary 112$t$ of the first section 112 of the buried layer 111 may be lower than the top boundary 110$t$ of the second section 110 of the buried layer 111. The bottom boundary 112$b$ of the first section 112 of the buried layer 111 may be lower than the bottom boundary 110$b$ of the second section 110 of the buried layer 111.

The first section 112 of the buried layer 111 may be aligned vertically below the first well. For example, the side boundary 112$x$ of the first section 112 of the buried layer 111 may be substantially coplanar with the side boundary 106$x$ of the first well 106. The top boundary 112$t$ and the bottom boundary 112$b$ of the first section 112 of the buried layer 111 may have substantially the same area as the top boundary 106$t$ and the bottom boundary 106$b$ of the first well 106. The first section 112 of the buried layer 111 may be in direct contact with the first well 106. For example, the top boundary 112$t$ of the first section 112 of the buried layer 111 may directly contact the bottom boundary 106$b$ of the first well 106.

The second section 110 of the buried layer 111 may directly contact the second well 108. For example, the top boundary 110$t$ of the second section 110 of the buried layer 111 may directly contact the bottom boundary 108$b$ of the second well 108. Preferably, the second section 110 of the buried layer 111 may be positioned below the second well 108 such that the side boundary 110$x$ of the buried layer 111 may be substantially coplanar with the outer side boundary 108$x$ of the second well 108. As described herein, the second well 108 and the buried layer 111 may have the same conductivity type (i.e., the second conductivity type). The second section 110 of the buried layer 111 may have a lower dopant concentration than the first section 112 of the buried layer 111. In other words, the first section 112 of the buried layer 111 may have a higher dopant concentration than the second section 110 of the buried layer 111. The second well 108 may have the same dopant concentration as the second section 110 of the buried layer 111. In an implementation, the second well 108 may have a dopant concentration in the range of about 1E16 atoms/cm$^3$ to about 1E17 atoms/cm$^3$. The first section 112 of the buried layer 111 may have a dopant concentration in the range of about 1E17 atoms/cm$^3$ to about 1E18 atoms/cm$^3$. The second section 110 of the buried layer 111 may have a dopant concentration in the range of about 1E16 atoms/cm$^3$ to about 1E17 atoms/cm$^3$.

The first well 106 may have an opposite conductivity type to the second well 108 and the buried layer 111 (i.e., the first conductivity type). For example, the second well 108 and the buried layer 111 may have N-type conductivities while the first well 106 may have a P-type conductivity. Alternatively, the second well 108 and the buried layer 111 may have P-type conductivities while the first well 106 may have an N-type conductivity. The first section 112 of the buried layer 111 may be in direct contact with the first well 106 to form an electrical junction (not shown). This electrical junction formed between the first section 112 of the buried layer 111 and the first well 106 may be a P-N junction. Photon absorption and carrier generation may occur in the electrical junction. The electrical junction may be configured to provide a zone for the multiplication of charge carriers (e.g., electrons and holes) and to absorb an incident photon.

The guard region 102$a$ may serve to focus the electric field on the multiplication zone in the electrical junction and prevent voltage breakdown at the side boundary 106$x$ of the first well 106. Thus, the impact ionization of charge carriers can be confined between the first section 112 of the buried layer 111 and the first well 106. The confinement of the electrical junction by the guard region 102$a$ may also improve various performance parameters of the device 100, such as preventing premature edge breakdown and failure of the device 100, increasing the quantum efficiency, increasing the probability of triggering the avalanche breakdown, and reducing the timing jitter.

The substrate 102 may include a semiconductor material, such as silicon, germanium, silicon germanium (SiGe), silicon carbide, and those consisting essentially of III-V compound semiconductors, such as GaAs, II-VI compound semiconductors such as ZnSe. The substrate 102 may be of an opposite conductivity to the buried layer 111. In other words, the substrate 102 may be of the second conductivity type. The substrate 102 may have a lower doping concentration than the first well 106. In an implementation, the substrate 102 may have a dopant concentration in the range of about 5E14 atoms/cm$^3$ to about 5E15 atoms/cm$^3$. The first well 106 may have a dopant concentration in the range of about 5E16 atoms/cm$^3$ to about 1E18 atoms/cm$^3$.

The device 100 may include a third well 118 in the substrate 102. The third well 118 may laterally surround and may be concentric with the second well 108 and the first well 106. The third well 118 may be laterally spaced apart from the second well 108 by a portion of the substrate 102. The third well 118 may have the same conductivity type as the first well 106 (i.e., the first conductivity type). In an implementation, the third well 118 may have a dopant concentration in the range of about 5E16 atoms/cm$^3$ to about 5E18 atoms/cm$^3$.

The device 100 may include a fourth well 104 in the substrate 102. The fourth well 104 may be laterally surrounded by the first well 106 and may also directly contact the first well 106. The fourth well 104 may have the same conductivity type as the first well 106 and may have a higher dopant concentration than the first well 106. In an implementation, the fourth well 104 may have a dopant concentration in the range of about 1E17 atoms/cm$^3$ to about 1E19 atoms/cm$^3$. The fourth well 104 may be formed in the first well 106 such that the fourth well 104 may have a top boundary 104$t$ that is coplanar with the top boundary 106$t$ of the first well 106 and the top surface of the substrate 102. The fourth well 104 may have a side boundary 104$x$ that directly contacts the first well 106. The fourth well 104 may have a bottom boundary 104$b$ that is above the bottom boundary 106$b$ of the first well 106.

Contact regions 114, 116, 120 may be formed in the substrate 102. A first contact region 114 may be in the first well 106, or in some implementations, in the fourth well 104. The first contact region may be of the same conductivity type as the first well 106 or the fourth well 104. The first contact region 114 may have a higher dopant concentration than the first well 106 and the fourth well 104. For example, the first contact region 114 may have a dopant concentration in the range of about 1E19 atoms/cm$^3$ to about 1E21 atoms/cm$^3$. A contact structure (not shown) may be formed on the first contact region 114. A second contact region 116 may be in the second well 108. The second contact region 116 may be of the same conductivity type as the second well 108. The second contact region 116 may have a higher dopant concentration than the second well 108. For example, the second contact region 116 may have a dopant concentration in the range of about 1E19 atoms/cm$^3$ to about 1E21 atoms/cm$^3$. A contact structure (not shown) may be formed on the second contact region 116. A third contact region 120 may be in the third well 118. The third contact region 120 may be of the same conductivity type as the third well 118. The third contact region 120 may have a higher dopant concentration than the third well 118. For example, the third contact region 120 may have a dopant concentration in the range of about 1E19 atoms/cm$^3$ to about 1E21 atoms/cm$^3$. A contact structure (not shown) may be formed on the third contact region 120.

Trench isolation structures 121, 122, 123 may be formed in the substrate 102. The trench isolation structures 122, 123 may be positioned laterally between the contact regions 114, 116, 120. For example, a trench isolation structure 122 may be positioned laterally between the contact regions 116 and 120 to act as an electrical isolation guard to prevent the formation of an electrical junction between the contact regions 116 and 120. Another trench isolation structure 123 may be in guard region 102$a$ and being laterally between the side boundary 106$x$ of the first well 106 and the inner side boundary 108$y$ of the second well 108. The trench isolation structure 123 may have a first side abutting the contact region 116 and a second side spaced apart from the side boundary 106$x$ of the first well 106 by guard region 102$a$. A trench isolation structure 121 may be positioned to laterally surround the third well 118, the second well 108, and the first well 106 to provide additional electrical isolation of the device 100 from other nearby semiconductor devices or devices formed on the substrate 102, which can improve its performance in a densely-packed or pixelated array of photodiodes, for example. The trench isolation structures 121, 122, 123 may each include an oxide (e.g., silicon dioxide) or a nitride (e.g., silicon nitride). The first well 106, the second well 108, the buried layer 111, and the fourth well 104 may form components of a photodiode in the device 100 while the third well 118 may function as a logic well in the device 100.

In some implementations, the third contact region 120 may be grounded while the second contact region 116 may be biased with a voltage. Current leakage may occur from the bottom boundary 112$b$ of the first section 112 of the buried layer 111 to the third well 118, which can inadvertently increase the power consumption of the device 100. Advantageously, increasing the thickness in the first section 112 of the buried layer 111 as compared to the second section 110 of the buried layer 111 may reduce the current leakage through the buried layer 111, for example, leakage from the bottom boundary 112$b$ of the first section 112 of the buried layer 111 into the substrate 102 and the third well 118.

More advantageously, having a lower dopant concentration in the second section 110 of the buried layer 111 and a higher dopant concentration in the first section 112 of the buried layer 111 may achieve a higher breakdown voltage between the second section 110 of the buried layer 111 and the third well 118 as compared to the breakdown voltage between the first section 112 of the buried layer 111 and the first well 106. A higher breakdown voltage between the second section 110 of the buried layer 111 and the third well 118 can prevent current flow between the second section 110 of the buried layer 111 and the third well 118 while ensuring current flow occurring only at the electrical junction between the first well 106 and the first section 112 of the buried layer 111. Furthermore, with a higher breakdown voltage between the third well 118 and the second section 110 of the buried layer 111, the lateral displacement between the third well 118 and the second section 110 of the buried layer can be decreased or made more compact. The increased compactness between the third well 118 and the second section 110 of the buried layer may reduce the spatial regions that are not sensitive to photon absorption when implementing an array of devices.

FIGS. 2 through 7 show a set of steps that may be used to create the example device described herein.

As used herein, "deposition techniques" refer to the process of applying a material over another material (or the substrate). Exemplary techniques for deposition include, but are not limited to, spin-on coating, sputtering, chemical vapor deposition (CVD), physical vapor deposition (PVD), molecular beam deposition (MBD), pulsed laser deposition (PLD), liquid source misted chemical deposition (LSMCD), atomic layer deposition (ALD).

Additionally, "patterning techniques" include deposition of material or photoresist, patterning, exposure, development, etching, cleaning, and/or removal of the material or photoresist as required in forming a described pattern, structure, or opening. Examples of techniques for patterning include, but are not limited to, wet etch lithographic processes, dry etch lithographic processes, or direct patterning processes. Such techniques may use mask sets and mask layers.

Figure 2:
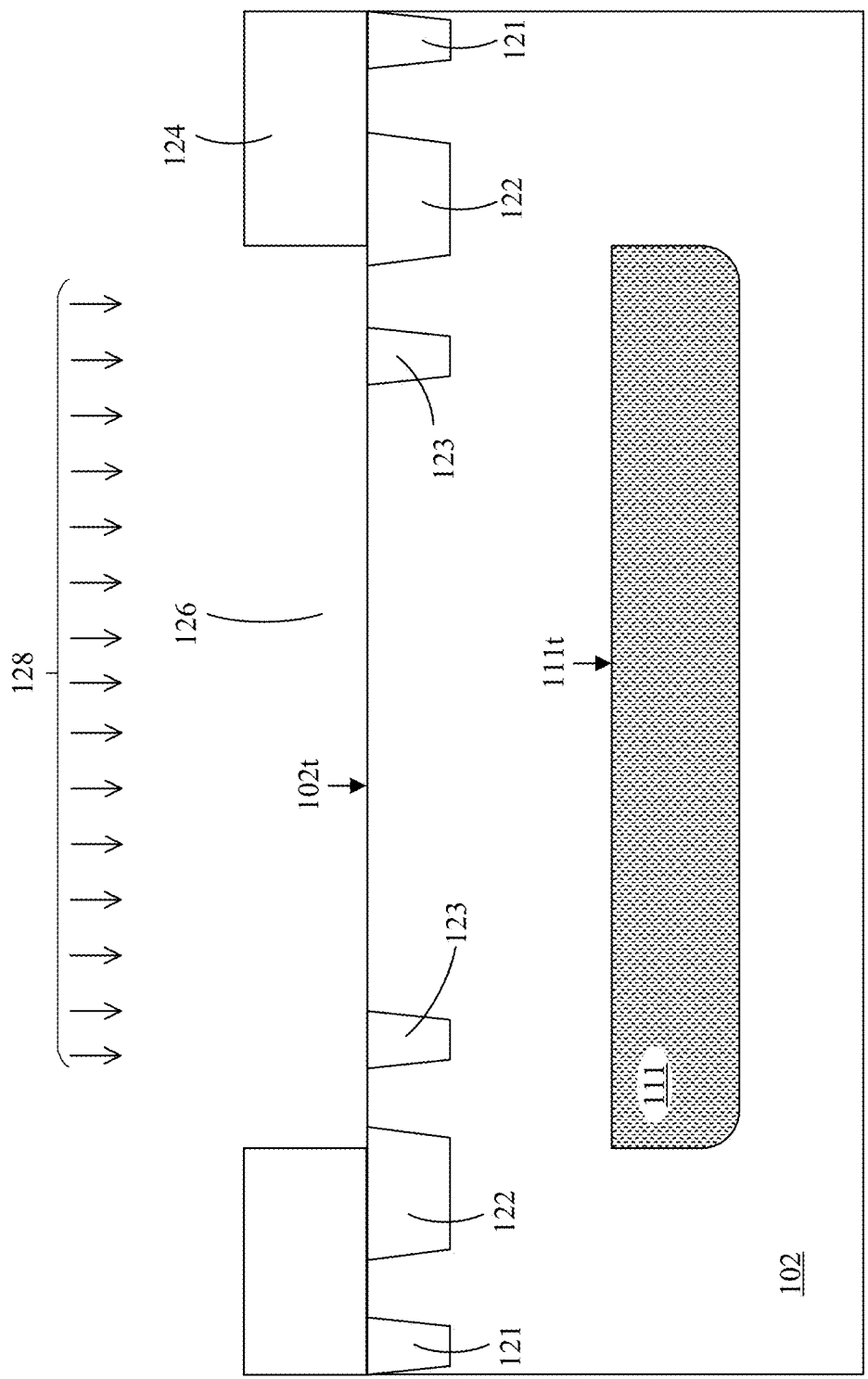
FIG. 2 through FIG. 7 are cross-sectional views depicting structures at various stages of a process of fabricating the exemplary devices described herein.

Referring to FIG. 2, a structure for the fabrication of a device for use in optoelectronic applications may include a substrate 102. Trench isolation structures 121, 122, 123 may be formed in the substrate 102. The substrate 102 may be lightly doped with a dopant having either an N-type conductivity or a P-type conductivity. Exemplary dopants for N-type conductivity doping may include, but are not limited to, arsenic, phosphorus, or antimony. Exemplary dopants for P-type conductivity doping may include, but are not limited to, boron, aluminum, or gallium.

A buried layer 111 may be formed in the substrate. For example, a doping process 128 may be performed to introduce dopants into the substrate 102. An ion implantation technique may be used to dope the substrate 102. The buried layer 111 may be formed with a top boundary 111$t$ that is below a top surface 102$t$ of the substrate 102. A first mask layer 124 may be used in the formation of the buried layer 111. For example, the first mask layer 124 may be deposited on the substrate 102. The first mask layer 124 may be patterned to form an opening to expose a portion of the substrate 102 for the introduction of dopants by the doping process 128. The buried layer 111 may be doped with dopants of the same conductivity type as the substrate 102. The dopant concentration of the buried layer 111 may be greater than the dopant concentration of the substrate 102. The first mask layer 124 may be removed after the formation of the buried layer 111.

Figure 3:
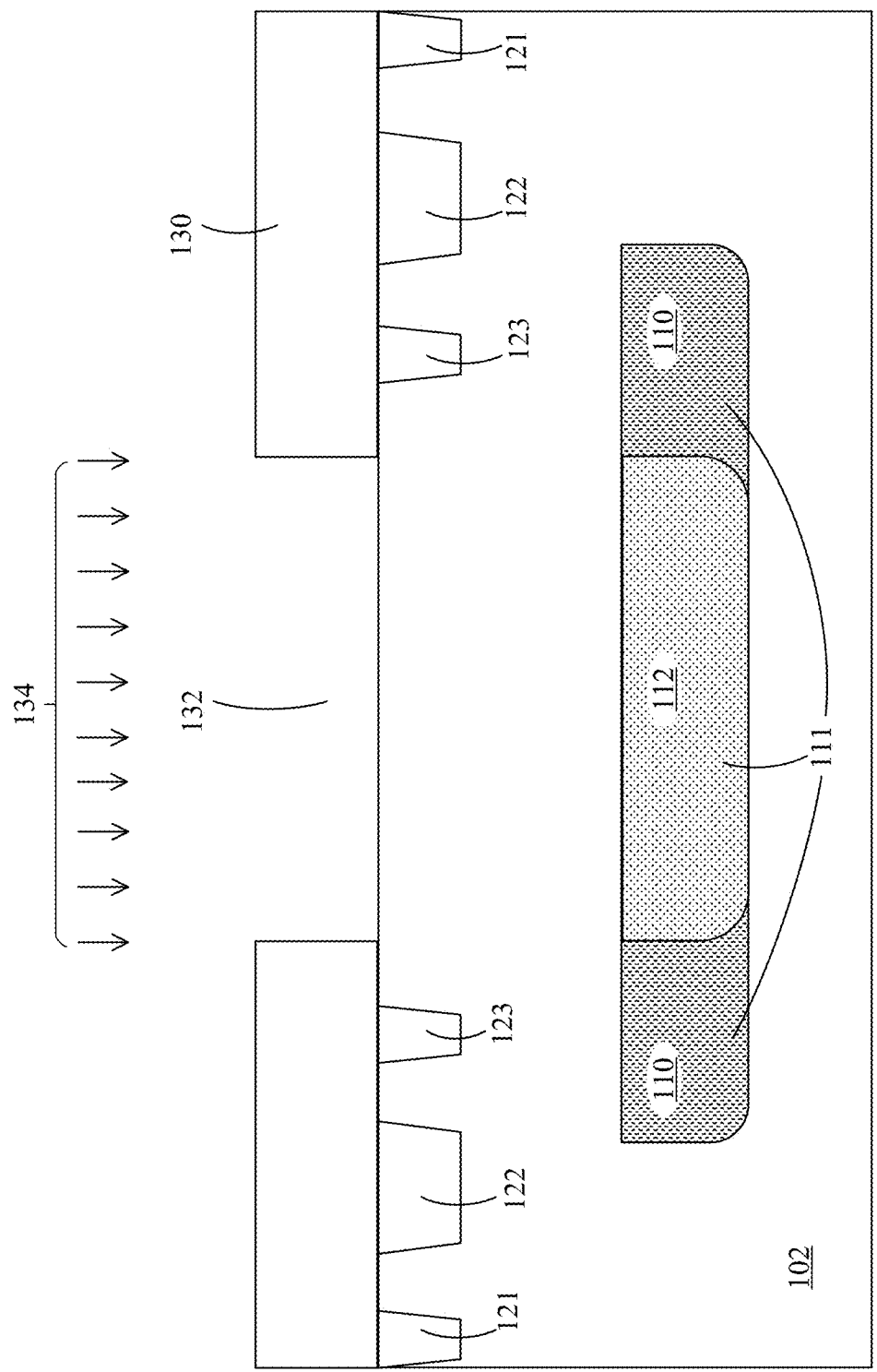

Referring to FIG. 3, the buried layer 111 in the substrate 102 may undergo further processing to form a first section 112 and a second section 110. A second mask layer 130 may be deposited on the substrate 102 and patterned to form an opening 132 to expose a portion of the substrate 102. The opening 132 in the second mask layer 130 may expose a smaller area on the top surface of the substrate 102 as compared to the opening 126 in the first mask layer 124. A doping process 134 may be performed to introduce dopants through the opening 126 in the second mask layer 130 to form the first section 112 of the buried layer 111. The doping process 134 may use dopants of the same conductivity type as the dopants used in the doping process 128 described in FIG. 2. Since the opening 132 in the second mask layer 130 exposes a smaller area on the top surface of the substrate 102 than the opening 126 in the first mask layer 124, the dopant concentration of the second section 110 of the buried layer 111 may remain substantially the same after the doping process 134 while the resulting dopant concentration in the first section 112 of the buried layer 111 may be larger than the dopant concentration in the second section 110 of the buried layer 111 after the doping process 134.

Figure 4:
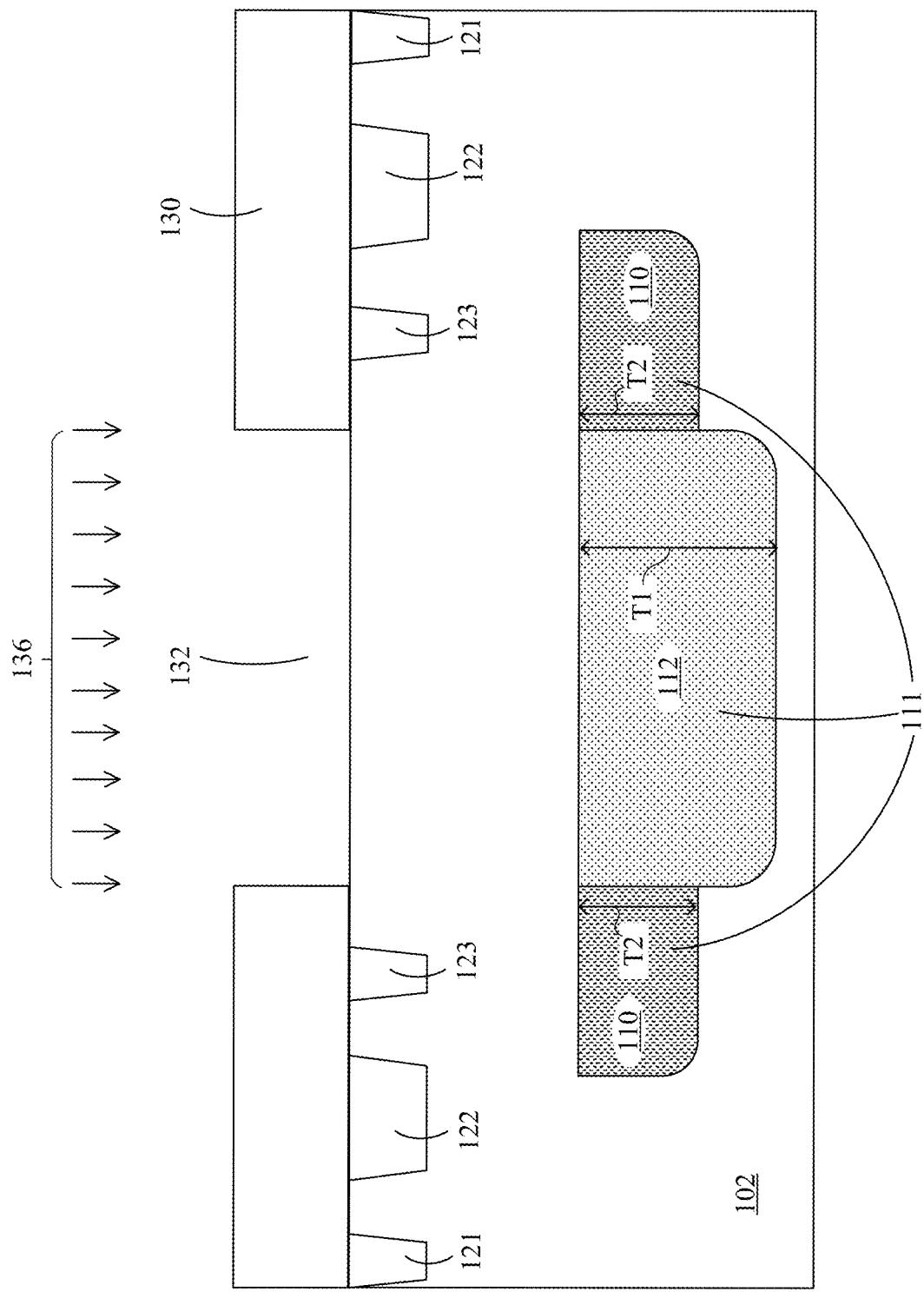

Referring to FIG. 4, the first section 112 of the buried layer 111 may be formed with a thickness T1 and the second section 110 of the buried layer 111 may be formed with a thickness T2. The thickness T1 of the first section 112 of the buried layer 111 may be increased by performing a doping process 136 to introduce dopants through the opening 132 in the second mask layer 130. The doping process 136 may utilize a higher energy implant than the doping process 134 described in FIG. 3 to create the increased thickness of the first section of the buried layer. The doping process 136 may use dopants of the same conductivity type as the dopants used in the doping process 128 described in FIG. 2, or the doping process 134 described in FIG. 3. Since the doping process 136 uses the same patterned mask layer (i.e., the mask layer 130 having the opening 132) as the doping process 134 described in FIG. 3, the thickness T2 of the second section 110 of the buried layer 111 may remain substantially the same after performing the doping process 136. Accordingly, the thickness T1 of the first section 112 of the buried layer 111 may be larger than the thickness T2 of the second section 110 of the buried layer 111. As described herein, the first section 112 of the buried layer 111 may be formed using the two doping processes 134 and 136, in which the doping process 136 may use a higher energy implant than the doping process 134.

Figure 5:
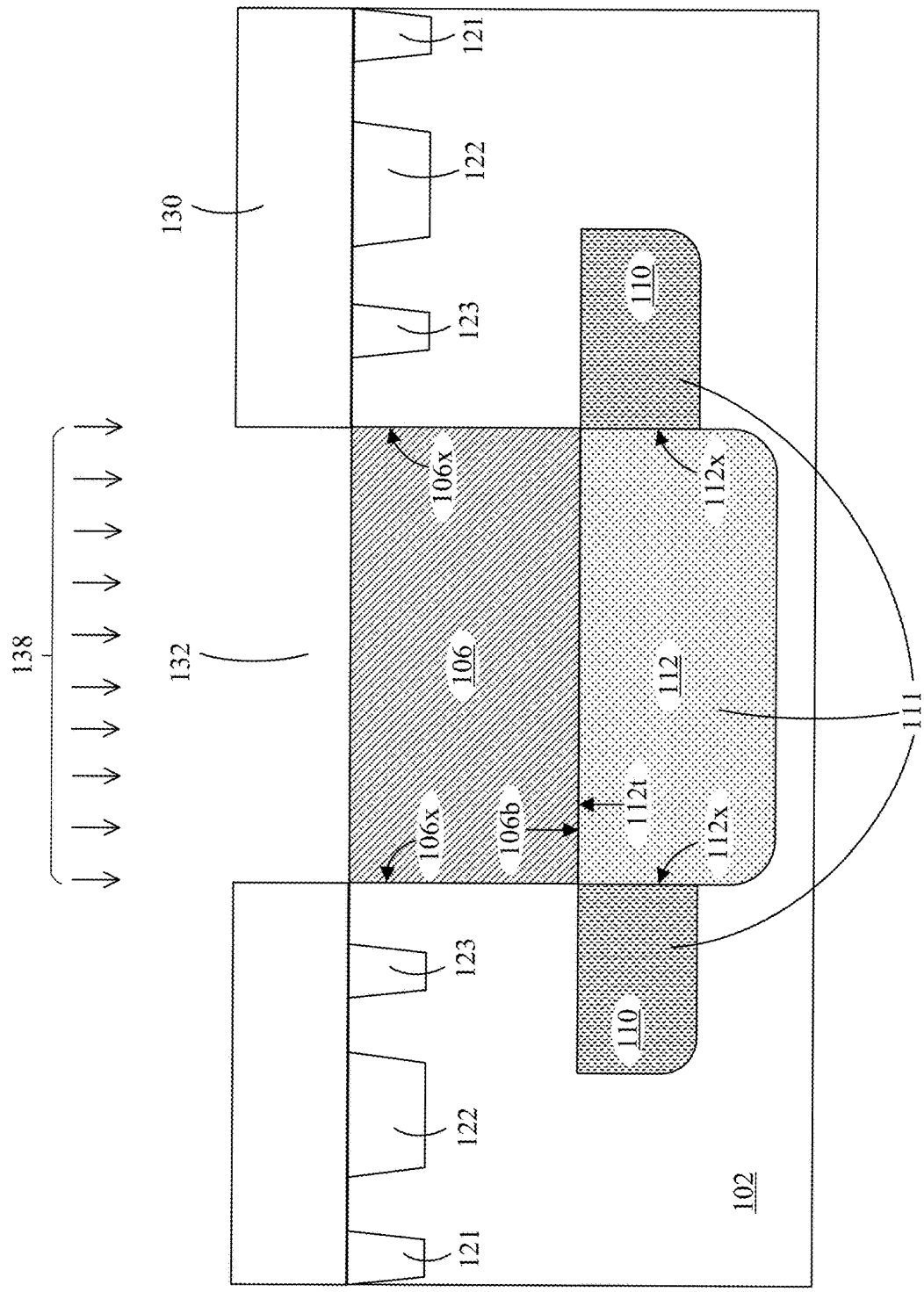

Referring to FIG. 5, a first well 106 may be formed over the buried layer 111. The first well 106 may be formed by performing a doping process 138 to introduce dopants through the opening 126 in the second mask layer 130. In other words, the formation of the first well 106 may use the same patterned mask layer as the formation of the first section 112 of the buried layer 111. The first well 106 may be formed to have an opposite conductivity type to the buried layer 111. For example, the doping process 138 may use dopants of an opposite conductivity type to the dopants used in the doping process 136 described in FIG. 4 and the doping process 134 described in FIG. 3. The depth of the dopants introduced during the doping process 138 may be controlled such that the first well 106 may be formed with a bottom boundary 106$b$ that directly contacts a top boundary 112$t$ of the first section 112 of the buried layer 111. The doping process 138 to form the first well 106 may use the same patterned mask layer as the doping processes 134, 136 to form the first section 112 of the buried layer 111. Accordingly, the first well 106 may be formed to be aligned vertically above the first section 112 of the buried layer 111. For example, a side boundary 112$x$ of the first section 112 of the buried layer 111 may be substantially coplanar with a side boundary 106$x$ of the first well 106. The top boundary 112$t$ of the first section 112 of the buried layer 111 may have substantially the same area as the bottom boundary 106$b$ of the first well 106. The mask layer 130 may be removed after forming the first well 106.

Figure 6:
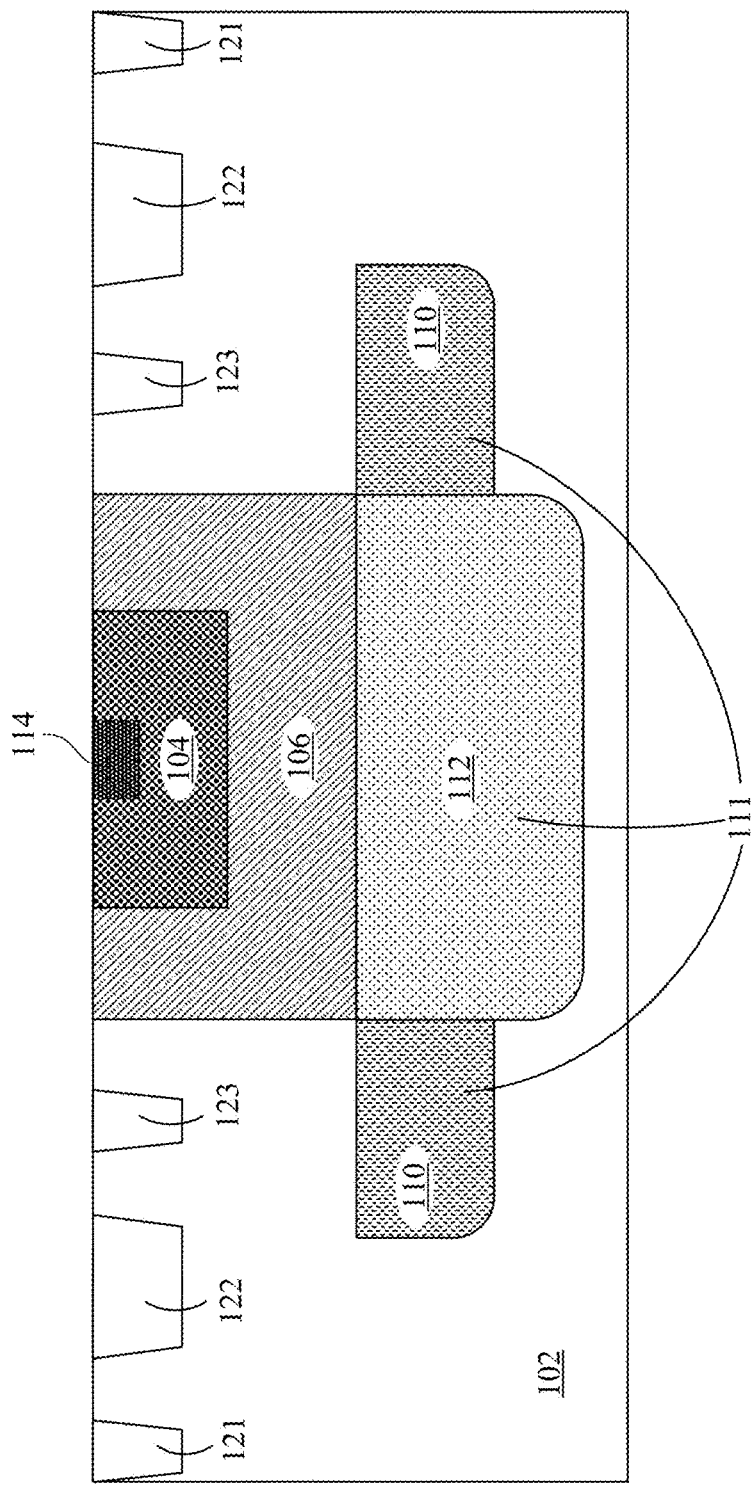

Referring to FIG. 6, a fourth well 104 and a first contact region 114 may be formed in the substrate 102. For example, the fourth well 104 may be formed by introducing dopants into a top boundary of the first well 106 with the use of a mask layer (not shown). The fourth well 104 may have the same conductivity as the first well 106. The first contact region 114 may be formed by introducing dopants into a top boundary of the fourth well 104 with the use of a mask layer (not shown). The first contact region 114 may have the same conductivity as the fourth well 104. The formation of the fourth well 104 may use a different mask layer from the formation of the first contact region 114.

Figure 7:
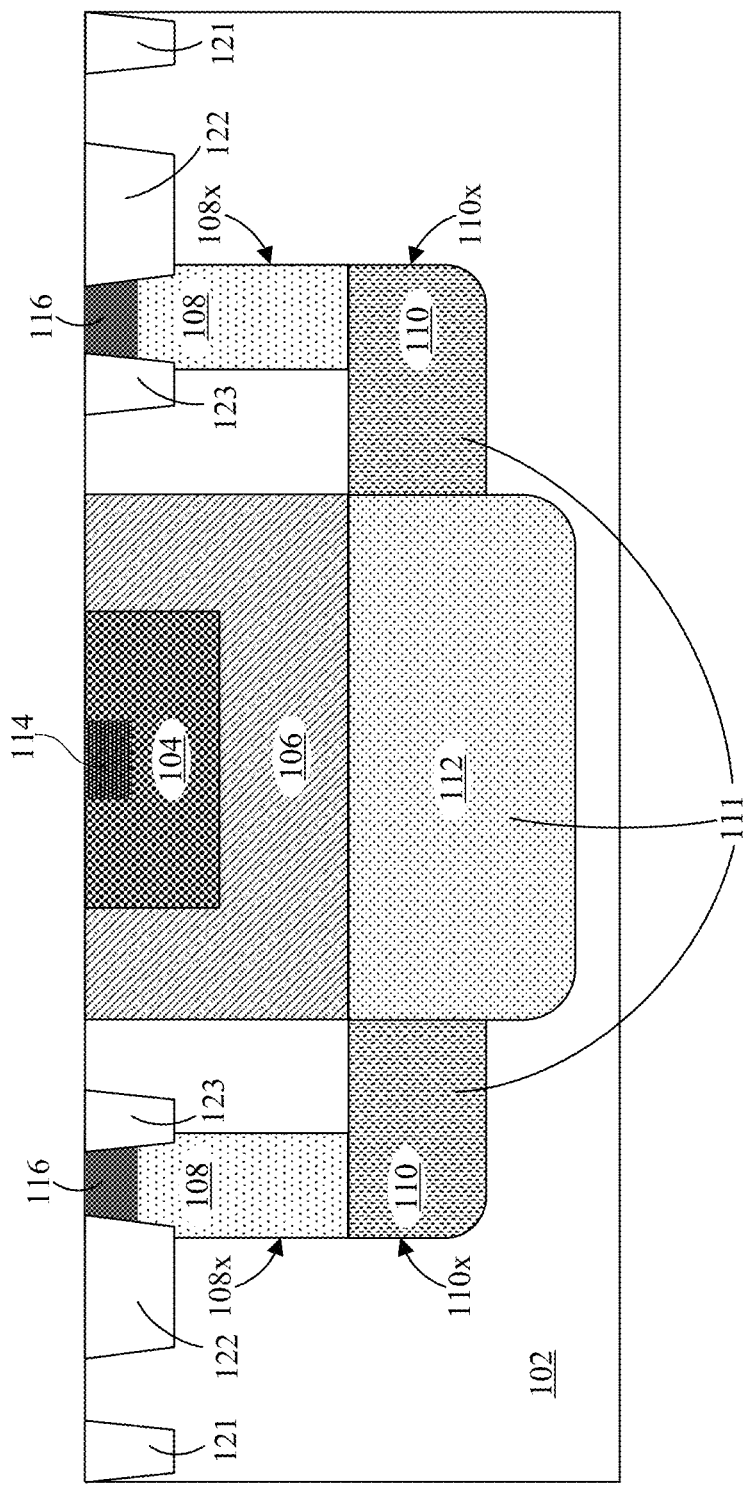

Referring to FIG. 7, a second well 108 and a second contact region 116 may be formed in the substrate 102. For example, the second well 108 may be formed over the second section 110 of the buried layer 111 by introducing dopants into an area on a top surface of the substrate 102 being laterally bounded by the trench isolation structures 122, 123, with the use of a mask layer (not shown). The depth of the dopants introduced into the substrate 102 may be controlled such that the second well 108 directly contacts the second section 110 of the buried layer 111. Preferably, the outer side boundary 108$x$ of the second well 108 may be aligned to be coplanar with the side boundary 110$x$ of the second section 110 of the buried layer 111 with the use of the mask layer (not shown). The doping of the second well 108 may use dopants of the same conductivity type as the dopants used to form the buried layer 111. The second contact region 116 may be subsequently formed to be aligned vertically above the second well 108 by introducing dopants into the area on the top surface of the substrate 102 being laterally bounded by the trench isolation structures 122, 123. Formation of the second contact region 116 may use the same mask layer as the formation of the second well 108.

The structure shown in FIG. 7 may undergo further processing to form the structure shown in FIG. 1. For example, the third well 118 may be formed in the substrate 102 by doping an area on a top surface of the substrate 102 being laterally bounded by the trench isolation structures 121, 122, with the use of a mask layer. The doping of the third well 118 may use dopants of the same conductivity type as the dopants used to form the first well 106. The third contact region 120 may be subsequently formed to be aligned vertically above the third well 118 by introducing dopants into the area on the top surface of the substrate 102 being laterally bounded by the trench isolation structures 121, 122. Formation of the third contact region 120 may use the same mask layer as the formation of the third well 118.

Throughout this disclosure, it is to be understood that if a method is described herein as involving a series of steps, the order of such steps as presented herein is not necessarily the only order in which such steps may be performed, and certain of the stated steps may possibly be omitted and/or certain other steps not described herein may possibly be added to the method. Furthermore, the terms "comprise", "include", "have", and any variations thereof, are intended to cover a non-exclusive inclusion, such that a process, method, article, or device that comprises a list of elements is not necessarily limited to those elements, but may include other elements not expressly listed or inherent to such process, method, article, or device. Occurrences of the phrase "in an embodiment" herein do not necessarily all refer to the same embodiment, occurrences of the phrase "in an implementation" herein do not necessarily all refer to the same implementation, and occurrences of the phrase "in an example" herein do not necessarily all refer to the same example.

The descriptions of the various embodiments of the present disclosure have been presented for purposes of illustration, but are not intended to be exhaustive or limited to the embodiments disclosed. Modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein. Furthermore, there is no intention to be bound by any theory presented in the preceding background or the following detailed description. Additionally, the various tasks and processes described herein may be incorporated into a more comprehensive procedure or process having additional functionality not described in detail herein.

References herein to terms modified by language of approximation, such as "about", "approximately", and "substantially", are not to be limited to the precise value specified. The language of approximation may correspond to the precision of an instrument used to measure the value and, unless otherwise dependent on the precision of the instrument, may indicate +/−10% of the stated value(s).

As will be readily apparent to those skilled in the art upon a complete reading of the present application, the semiconductor devices and methods disclosed herein may be employed in manufacturing a variety of different integrated circuit products and modules, including, but not limited to, CMOS devices, image sensors, optoelectronic modules, LIDAR instrumentation, and LIDAR systems, for example.

What is claimed is:

1. A device comprising:
a substrate;
a first well of a first conductivity type in the substrate, the first well has a side boundary;
a second well of a second conductivity type in the substrate, the second conductivity type is of an opposite conductivity type to the first conductivity type, the first well is concentric with and laterally surrounded by the second well; and
a buried layer of the second conductivity type in the substrate, the buried layer is below the first well and the second well, the buried layer has a first section and a second section, the first section has a larger thickness than the second section, the first section is concentric with and laterally surrounded by the second section, wherein the first section of the buried layer is aligned vertically below and in direct contact with the first well, and wherein the first section of the buried layer has a side boundary, and the side boundary of the first section of the buried layer is coplanar with the side boundary of the first well.

2. The device of claim 1, wherein the first section of the buried layer has a bottom boundary, the second section of the buried layer has a bottom boundary, and the bottom boundary of the first section of the buried layer is lower than the bottom boundary of the second section of the buried layer.

3. The device of claim 2, wherein the second section of the buried layer is in direct contact with the second well.

4. The device of claim 2, wherein the first well has a top boundary, and the bottom boundary of the first section of the buried layer has the same area as the top boundary of the first well.

5. The device of claim 3, wherein the second well has a bottom boundary, the second section of the buried layer has a top boundary, and the top boundary of the second section of the buried layer directly contacts the bottom boundary of the second well.

6. The device of claim 3, wherein the second section of the buried layer has a side boundary, the second well has an outer side boundary, and the outer side boundary of the second well is coplanar with the side boundary of the second section of the buried layer.

7. The device of claim 6, wherein the second well has an inner side boundary, and the inner side boundary of the second well is laterally spaced apart from the side boundary of the first well.

8. The device of claim 3, further comprising a third well in the substrate, the third well having the same conductivity type as the first well, the third well laterally surrounds and is concentric with the second well and the first well.

9. The device of claim 8, further comprising a fourth well in the substrate, the fourth well having the same conductivity type as the first well, the fourth well is laterally surrounded by and in direct contact with the first well.

10. The device of claim 1, wherein the second section of the buried layer has a lower dopant concentration than the first section of the buried layer.

11. A device comprising:
a substrate;
a first well of a first conductivity type in the substrate, the first well has a side boundary;

a second well of a second conductivity type in the substrate, the second conductivity type is of an opposite conductivity type to the first conductivity type, the first well is concentric with and laterally surrounded by the second well; and a buried layer of the second conductivity type in the substrate, the buried layer is below the first well and the second well, the buried layer has a first section and a second section, the first section is concentric with and laterally surrounded by the second section, the second section of the buried layer has a lower dopant concentration than the first section of the buried layer, wherein the first section of the buried layer is aligned vertically below and in direct contact with the first well, and wherein the first section of the buried layer has a side boundary, and the side boundary of the first section of the buried layer is coplanar with the side boundary of the first well.

12. The device of claim 11, wherein the first section of the buried layer has a larger thickness than the second section of the buried layer.

13. The device of claim 12, wherein the first section of the buried layer has a bottom boundary, the second section of the buried layer has a bottom boundary, and the bottom boundary of the first section of the buried layer is lower than the bottom boundary of the second section of the buried layer.

14. The device of claim 12, wherein the second section of the buried layer has a side boundary, the second well has an outer side boundary and an inner side boundary, wherein the outer side boundary of the second well is coplanar with the side boundary of the second section of the buried layer, and wherein the inner side boundary of the second well is laterally spaced apart from the side boundary of the first well.

15. The device of claim 14, wherein the second well has a bottom boundary, the second section of the buried layer has a top boundary, and the top boundary of the second section of the buried layer directly contacts the bottom boundary of the second well.

16. A method of forming a device, the method comprising:

forming a first well of a first conductivity type in a substrate, the first well has a side boundary;

forming a second well of a second conductivity type in the substrate, the second conductivity type is of an opposite conductivity type to the first conductivity type, the first well is formed to be concentric with and laterally surrounded by the second well; and forming a buried layer of the second conductivity type in the substrate, the buried layer is formed below the first well and the second well, the buried layer has a first section and a second section, the first section of the buried layer is formed with a larger thickness than the second section of the buried layer, the first section of the buried layer is formed to be concentric with and laterally surrounded by the second section of the buried layer, wherein the first section of the buried layer is formed to be aligned vertically below and in direct contact with the first well, and wherein the first section of the buried layer has a side boundary, and the side boundary of the first section of the buried layer is coplanar with the side boundary of the first well.

17. The method of claim 16, wherein the second section of the buried layer is formed with a lower dopant concentration than the first section of the buried layer.

18. The method of claim 16, wherein the first section of the buried layer and the first well are formed using the same patterned mask layer.

19. The method of claim 16, wherein the first section of the buried layer is formed using two doping processes.

* * * * *